US012777884B2

(12) United States Patent
Iinuma

(10) Patent No.: US 12,777,884 B2
(45) Date of Patent: Oct. 27, 2026

(54) SEMICONDUCTOR INSPECTION APPARATUS AND SEMICONDUCTOR MANUFACTURING APPARATUS

(71) Applicant: Mitsubishi Electric Corporation, Tokyo (JP)

(72) Inventor: Motoki Iinuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 681 days.

(21) Appl. No.: 18/295,802

(22) Filed: Apr. 4, 2023

(65) Prior Publication Data

US 2024/0071795 A1 Feb. 29, 2024

(30) Foreign Application Priority Data

Aug. 31, 2022 (JP) ................................ 2022-138639

(51) Int. Cl.
*H10P 72/00* (2026.01)
*G01N 21/95* (2006.01)
(Continued)

(52) U.S. Cl.
CPC ..... *H10P 72/0616* (2026.01); *G01N 21/9501* (2013.01); *G06T 7/0004* (2013.01);
(Continued)

(58) Field of Classification Search
CPC .......... H01L 21/67288; G01N 21/9501; G06T 7/0004; H04N 23/56
See application file for complete search history.

(56) References Cited

U.S. PATENT DOCUMENTS 5,062,565 A * 11/1991 Wood ...................... H01L 24/75 228/9
2003/0116727 A1* 6/2003 Burnett ............ G01N 21/95684 250/559.42
(Continued)

FOREIGN PATENT DOCUMENTS

JP H06-74727 A 3/1994
JP 2006-278715 A 10/2006
(Continued)

OTHER PUBLICATIONS

An Office Action; "Notice of Reasons for Refusal," mailed by the Japanese Patent Office on Jun. 17, 2025, which corresponds to Japanese Patent Application No. 2022-138639 and is related to U.S. Appl. No. 18/295,802; with English language translation.
(Continued)

*Primary Examiner* — Michael A Lyons
*Assistant Examiner* — Mohamed Doumbia
(74) *Attorney, Agent, or Firm* — Studebaker Brackett PLLC

(57) ABSTRACT

A semiconductor inspection apparatus of this disclosure is a semiconductor inspection apparatus that performs a visual inspection of, as an inspection target, a semiconductor module on a surface of which a plurality of semiconductor devices connected to one another by a wire is mounted. This semiconductor inspection apparatus includes a first light source that is arranged in a first casing, emits light in a specific wavelength band or white light, and constitutes a part of a coaxial vertical illumination system for the inspection target, and a second light source that obliquely irradiates the inspection target with light in at least one wavelength range among a red band, a blue band, and an infrared range from a light source that is arranged in a ring shape around
(Continued)

an optical axis of incident light of the coaxial vertical illumination system.

6 Claims, 11 Drawing Sheets

(51) Int. Cl.
*G06T 7/00* (2017.01)
*H04N 23/56* (2023.01)

(52) U.S. Cl.
CPC ....... *H04N 23/56* (2023.01); *G01N 2201/021* (2013.01); *G01N 2201/062* (2013.01); *G01N 2201/0636* (2013.01); *G06T 2207/30148* (2013.01)

(56) References Cited

U.S. PATENT DOCUMENTS

| | | | | |
|---|---|---|---|---|
| 2006/0007407 A1* | 1/2006 | Matsui | G03B 33/08 | 353/84 |
| 2008/0259600 A1* | 10/2008 | Pohlert | H05B 45/20 | 348/E5.029 |
| 2018/0328855 A1* | 11/2018 | Kido | G01N 21/8851 | |

FOREIGN PATENT DOCUMENTS

| | | | | | |
|---|---|---|---|---|---|
| JP | 2007-212431 | A | | 8/2007 | |
| JP | 2014-16245 | A | | 1/2014 | |
| JP | 2014-48073 | A | | 3/2014 | |
| JP | 2014102208 | A | * | 6/2014 | G01N 21/8806 |
| JP | 2015-137921 | A | | 7/2015 | |
| JP | 2016-184711 | A | | 10/2016 | |
| JP | 7578718 | B2 | * | 11/2024 | G01B 11/26 |
| WO | WO-03077568 | A1 | * | 9/2003 | H04N 23/16 |

OTHER PUBLICATIONS

Handbook of Optex FA Co., Ltd.; Basic Knowledge of LED Illumination for Image Processing—Improving Inspection Images by Selecting Illumination; pp. 47; Jun. 24, 2021; [online] https://www.optexfa.jp/online_learning2021/textbox/d1_text.pdf.

* cited by examiner

SEMICONDUCTOR INSPECTION APPARATUS AND SEMICONDUCTOR MANUFACTURING APPARATUS

BACKGROUND OF THE INVENTION

Field

This disclosure relates to a semiconductor inspection apparatus and a semiconductor manufacturing apparatus, particularly to a semiconductor inspection apparatus and a semiconductor manufacturing apparatus suitable for a visual inspection of a power semiconductor.

Background

In the field of optical visual inspection apparatuses that inspect the external appearances of semiconductor wafers and the like, JP 2007-212431 A discloses a method of inspecting a surface of an inspection target by changing, through a wavelength filter, the wavelength of coaxial vertical illumination light to irradiate the inspection target with. Thus, defects such as contaminants and flaws present on the surface can be detected.

To meet the demand for sophistication, power semiconductors have multiple types of semiconductor devices, such as an integrated circuit (IC), an insulated-gate bipolar transistor (IGBT), a freewheeling diode (FwDi), and a converter-diode (Conv.-Di), electrically connected to one other by a wire or the like to form a module. A visual inspection of surfaces of these semiconductor devices requires coaxial vertical illumination in a plurality of colors according to the film quality.

Concerning the relationship between imaging by a camera and the color of illumination, for example, Non-Patent Literature 1 (Handbook of OPTEX FA Co., Ltd.) shows a schematic view of imaging in a case where white, red, green, and blue illuminations are used.

Conventional optical visual inspection apparatuses can detect defects in flat inspection targets, such as semiconductor wafers. However, when it comes to inspection targets having surface irregularities due to a wire etc., such as power semiconductor modules, the defect detection accuracy achieved by simply changing the illumination color of coaxial vertical illumination is poor, and visually defective products cannot be completely excluded.

Non-Patent Literature 1: Handbook of OPTEX FA Co., Ltd., "Basic Knowledge of LED Illumination for Image Processing Improving Inspection Images by Selecting Illumination," P. 47, <https://www.optex-fajp/online_learning2021/textbox/d1_text.pdf>

SUMMARY

The present disclosure has been contrived to solve this problem, and a first object thereof is to provide a semiconductor inspection apparatus that can detect defects and exclude visually defective products in a visual inspection step even when the inspection target has surface irregularities due to a wire etc.

The present disclosure has been made to solve the above-described problem, and has as its second object to provide a semiconductor manufacturing apparatus that can detect defects and exclude visually defective products in a visual inspection step even when the inspection target has surface irregularities due to a wire etc.

The features and advantages of the present disclosure may be summarized as follows.

According to one aspect of the present disclosure, a semiconductor inspection apparatus that performs a visual inspection of, as an inspection target, a semiconductor module on a surface of which a plurality of semiconductor devices connected to one another by a wire is mounted, the semiconductor inspection apparatus comprising: a first light source that is arranged in a first casing and emits light in a specific wavelength band or white light; a half mirror that is arranged inside a second casing joined to the first casing, and that reflects part of light having been emitted from the first light source and having passed through the first casing to generate incident light that normally enters the inspection target; a camera that is arranged on the same axis as an optical axis of the incident light and an optical axis of reflected light resulting from the incident light being reflected by the inspection target, and that images transmitted light having been transmitted through the half mirror; and a second light source that obliquely irradiates the inspection target with light in at least one wavelength range among a red band, a blue band, and an infrared range from a light source that is arranged in a ring shape around the optical axis of the incident light.

According to another aspect of the present disclosure, a semiconductor manufacturing apparatus comprising: a first unit that performs a manufacturing step of joining a back surface of a semiconductor device to a matrix of a power semiconductor module; a second unit that performs a manufacturing step of electrically connecting an electrode exposed from another device and a surface of the semiconductor device to each other; and a third unit that includes the semiconductor inspection apparatus according to claim 1 and performs a visual inspection of a power semiconductor module manufactured in the first unit and the second unit.

Other and further objects, features and advantages of the disclosure will appear more fully from the following description.

DESCRIPTION OF EMBODIMENTS

First Embodiment

Figure 1:
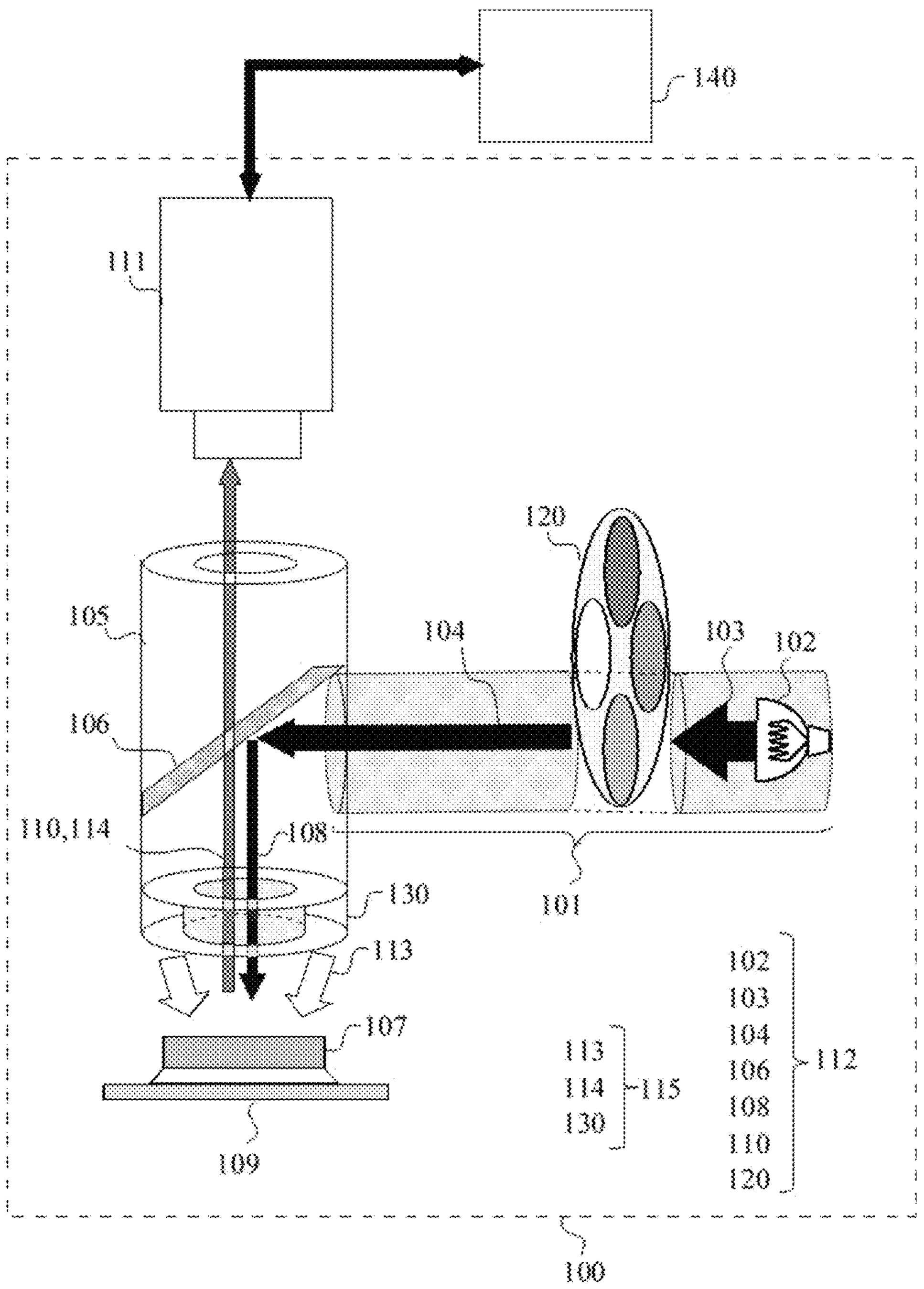
FIG. 1 is a view showing an example of the configuration of a semiconductor inspection apparatus according to a first embodiment of this disclosure.

FIG. 1 is a view showing an example of the configuration of a semiconductor inspection apparatus according to a first embodiment of this disclosure. In a semiconductor inspection apparatus 100, a first cylinder 101 includes a light source 102 having a continuous wavelength in a visible light range. The light source 102 is, for example, a halogen lamp. Light emitted from the light source 102 (hereinafter referred to as broad light 103) passes through an inside of the first cylinder 101 and is transmitted through one of a plurality of bandpass filters (hereinafter referred to as filters) arranged in a bandpass filter base 120. The light having been transmitted through the filter is sorted by wavelength and converted into monochromatic light 104 having a wavelength spectrum centered at a specific wavelength within the visible light range.

After being transmitted through the first cylinder 101, the monochromatic light 104 enters a half mirror 106 inside a second cylinder 105 that is joined to the first cylinder 101. The half mirror 106 is arranged such that the monochromatic light 104 obliquely enters the half mirror 106, and reflects part of the incident monochromatic light 104 in a vertically downward direction. The monochromatic light 104 having been reflected in the vertically downward direction turns into normal incident light 108 that normally enters an inspection target 107.

The normal incident light 108 is regularly reflected by the inspection target 107 placed on a stage 109 and turns into returning light 110 that returns to an inside of the second cylinder 105. When the returning light 110 enters the half mirror 106, part of this light is transmitted and the transmitted light is focused on a camera 111. The camera 111 is arranged on the same axis as optical axes of the normal incident light 108 and the returning light. The camera 111 is an image sensor having an imaging device, such as a charge-coupled device (CCD) or a complementary metal-oxide semiconductor (CMOS), that has a detection wavelength in the visible light range.

Thus, the light emitted from the light source 102 included in the first cylinder 101 constitutes a part of a coaxial vertical illumination system 112 in which the optical axes of the normal incident light 108 entering the inspection target 107 and the returning light 110 reflected by the inspection target 107 coincide with the optical axis of the camera 111. The coaxial vertical illumination system 112 is an optical system including the light source 102, the broad light 103, the monochromatic light 104, the half mirror 106, the normal incident light 108, the returning light 110, and the bandpass filter base 120.

On the other hand, a ring light 130 included in the second cylinder 105 at its vertically lower end emits oblique light 113 that obliquely enters the inspection target 107. The incident angle of the oblique light 113 is an angle different from that of the normal incident light 108. While the oblique light 113 is reflected by the inspection target 107, most of this light is regularly reflected and therefore does not reach the camera 111 on a vertically upper side. However, some rays of reflected light resulting from diffuse reflection that occurs at the same time as regular reflection travel vertically upward and reach the camera 111. (Hereinafter, these rays of reflected light will be referred to as diffused returning light 114).

Thus, the light emitted from the ring light 130 constitutes a part of a ring illumination system 115. The ring illumination system 115 is an optical system including the ring light 130, the oblique light 113, and the diffused returning light 114.

The returning light 110 and the diffused returning light 114 having reached the camera 111 are imaged by the imaging device, and the image taken is output to an image processing unit 140 as an image signal. Based on the input image signal, the image processing unit 140 performs a visual inspection of detecting defects such as contaminants and flaws present on the surface and determining the visual quality.

As has been described above using FIG. 1, the semiconductor inspection apparatus 100 includes the two types of illumination systems and performs a visual inspection of an inspection target.

It is not essential for the semiconductor inspection apparatus 100 to include the image processing unit 140 among its constituent elements. In this embodiment and the subsequent embodiments, unless clearly indicated, the semiconductor inspection apparatus does not include the image processing unit.

In the following, a suitable inspection target for each of the coaxial vertical illumination system 112 and the ring illumination system 115 will be described based continuously on FIG. 1.

The coaxial vertical illumination system 112 is suitable for an inspection target 107 with a flat surface. In the coaxial vertical illumination system 112, light regularly reflected by a flat part reaches the camera 111 in a sufficient amount of light, so that a great difference in reflectance can be created relative to a part where light is not regularly reflected due to a defect or the like. Thus, the flat part and other parts can be observed with a distinction made therebetween with high contrast.

However, when it comes to an inspection target 107 having surface irregularities, the coaxial vertical illumination system 112 cannot create a difference in surface reflectance as light is diffuse-reflected. Due to the difficulty of focusing the diffuse-reflected light on the camera 111, the resulting image has low contrast, which makes it difficult to detect a fine defect or contaminant at an irregular part.

On the other hand, the ring illumination system 115 is suitable for an inspection target 107 having surface irregularities. When the oblique light 113 emitted from the ring light 130 enters an irregular part of the surface, this light is diffuse-reflected and the resulting diffused returning light 114 reaches the camera, thereby allowing observation of the state of the irregular part. Thus, irregularities or defects such as contaminants that cannot be detected by the coaxial vertical illumination system 112 can also be detected.

In the semiconductor inspection apparatus 100 of this embodiment, the light source 102 included in the first cylinder 101 and the ring light 130 included in the second cylinder 105 are unitized. Thus, the coaxial vertical illumination system 112 and the ring illumination system 115 can be switched from one to the other within one unit for use.

By using the coaxial vertical illumination system 112, an image with clear contrast by regular reflection can be obtained. On the other hand, by using the ring illumination system 115, an image of surface irregularities can be obtained. Combining these two types of illumination systems makes it possible to more closely inspect the inspection target 107 and detect defects such as contaminants and flaws present on the surface in a visual inspection.

Figure 2:
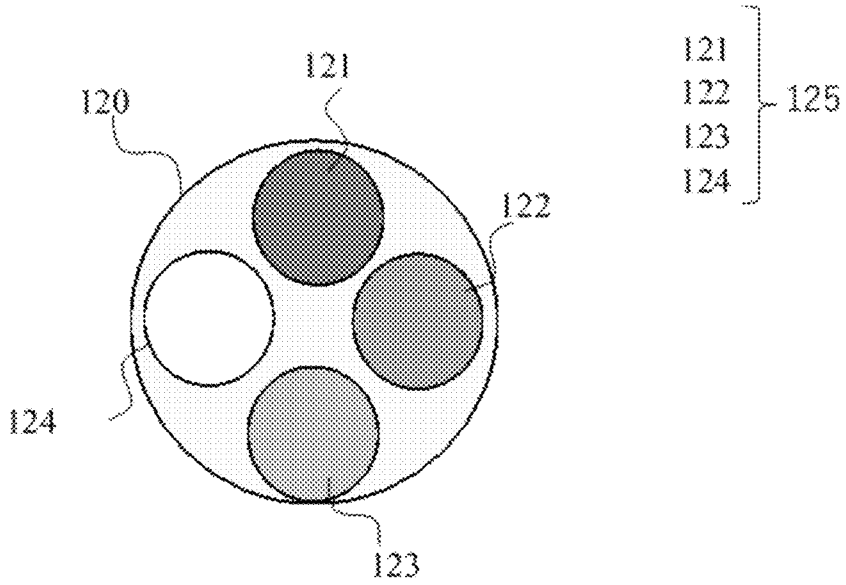
FIG. 2 is a view showing an example of the configuration of the bandpass filter base according to the first embodiment of this disclosure.

FIG. 2 is a view showing an example of the configuration of the bandpass filter base according to the first embodiment of this disclosure. The bandpass filter base 120 includes a plurality of filters that each selectively transmits only light in a specific wavelength band within the visible light range. For example, in the example of FIG. 2, the bandpass filter base 120 includes a red filter 121, a green filter 122, and a blue filter 123 of which transmission wavelengths are in a red band, a green band, and a blue band, respectively. Further, the bandpass filter base 120 includes a colorless filter 124 that does not have wavelength selectivity. Hereinafter, when it is not necessary to specify a filter of a specific color and the description applies to the filters of all the colors, these filters will be denoted by a new reference sign and written as filters 125.

The filters 125 of the respective colors in the bandpass filter base 120 are annularly arranged. The bandpass filter base 120 further has a rotating axis that is parallel to a central axis of the first cylinder 101, and rotates around this rotating axis. As the bandpass filter base 120 rotates, the filters 125 of the respective colors sequentially pass across an optical path of the broad light 103 emitted from the light source 102. By fixing a filter 125 that transmits only light in a desired wavelength band onto the optical path, the light from the light source 102 can be converted into desired monochromatic light 104.

In FIG. 2, the case where the bandpass filter base 120 includes all the filters for the red band, the green band, the blue band, and white has been described. However, it is not necessary to include these colors at the same time. Moreover, the wavelengths selected by the filters are not limited to the red band, the green band, the blue band, and white, and may instead be of other colors. The wavelengths can be suitably selected according to the characteristics of the inspection target to be inspected by the semiconductor inspection apparatus 100, the sensitivity performance of the camera 111, or other factors.

Figure 3:
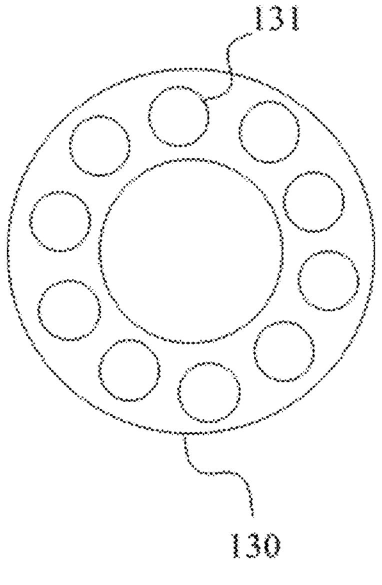
FIG. 3 is a view showing an example of the configuration of the ring light according to the first embodiment of this disclosure.

FIG. 3 is a view showing an example of the configuration of the ring light according to the first embodiment of this disclosure. The ring light 130 includes a plurality of illumination light sources 131 that is arranged at regular intervals in a ring shape. To reduce the time to wait for switching between the coaxial vertical illumination system 112 and the ring illumination system 115, light emitting diodes (LEDs) having high on-off responsiveness are used as the illumination light sources 131.

To obtain favorable reflection characteristics relative to gold, silver, or copper that is the main material of a wire in a semiconductor module, the wavelength range of the illumination light sources 131 is basically the red band (long-wavelength band) in which a high reflectance is exhibited within the visible light range. However, the blue band that is a short-wavelength band or an infrared range may be used for the purpose of imaging gold intentionally dark. The intensity of the illumination light sources 131 should be such that output can be adjusted to obtain a clear-contrast image.

The arrangement of the plurality of illumination light sources 131 is not limited to the example of FIG. 3, as long as they are arranged according to the size of a casing of the ring light 130 and the illumination light sources 131.

Figure 4:
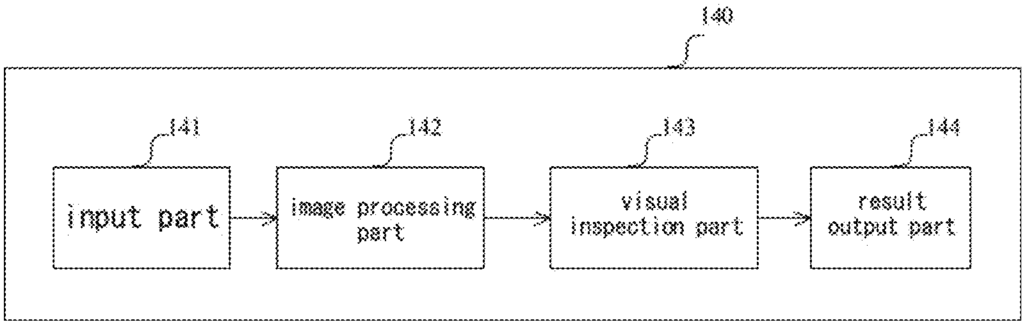
FIG. 4 is an example of the functional configuration of the image processing unit according to the first embodiment of this disclosure.

FIG. 4 is an example of the functional configuration of the image processing unit according to the first embodiment of this disclosure. An input part 141 is an interface through which an image signal from the camera 111 is input. An image processing part 142 is a preprocessing part for inspection that performs image editing, such as binarization processing, on the image signal. A visual inspection part 143 is a part that determines the visual quality of the inspection target 107 based on data resulting from image processing. A result output part 144 is a part that outputs a determination result.

Figure 5A:
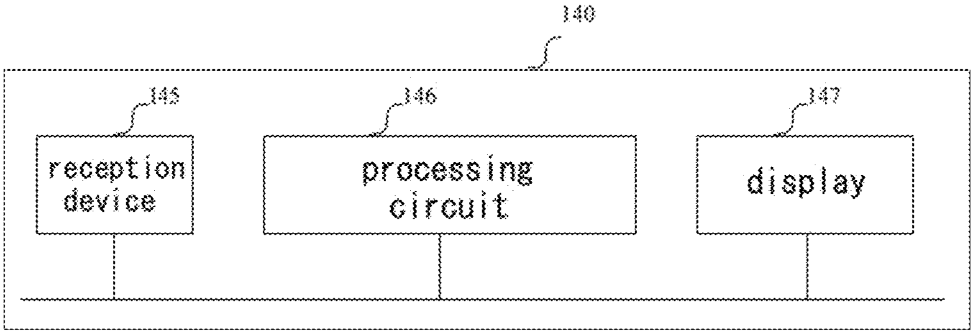
FIGS. 5A and 5B show examples of the configuration of the image processing unit according to the first embodiment of this disclosure, with FIG. 5A showing a case where the functions of the image processing unit are realized by hardware and FIG. 5B showing a case where these functions are realized by software.
Figure 5B:
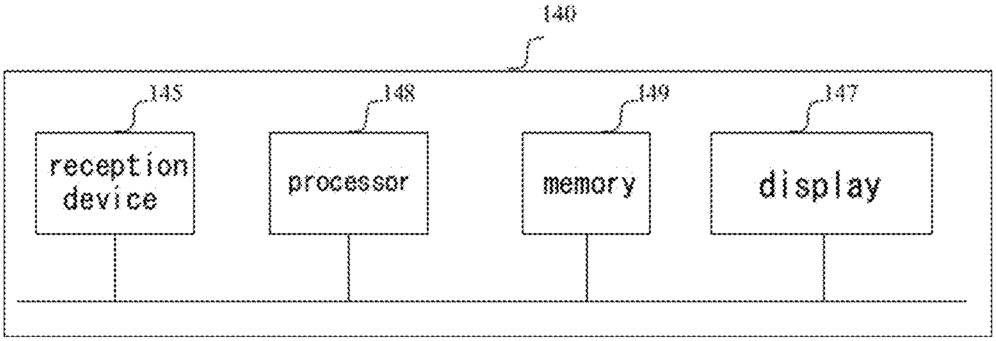

FIGS. 5A and 5B show examples of the configuration of the image processing unit according to the first embodiment of this disclosure, with FIG. 5A showing a case where the functions of the image processing unit are realized by hardware and FIG. 5B showing a case where these functions are realized by software. The input part 141 and the result output part 144 described in FIG. 4 are a reception device 145 and a display 147, respectively. Further, the functions of the image processing part 142 and the visual inspection part 143 are realized by a processing circuit. The processing circuit may be implemented using dedicated hardware as in FIG. 5A. Alternatively, as in FIG. 5B, the processing circuit may be implemented by software using a central processing unit (CPU; also called a processor) that executes programs stored in a memory.

In the case where the processing circuit is dedicated hardware, a processing circuit 146 corresponds to, for example, a single circuit, a decoding circuit, a programed processor, a processor for parallel program execution, an application-specific integrated circuit (ASIC), a field-programmable gate array (FPGA), or a combination thereof. The function of each of the image processing part 142 and the visual inspection part 143 may be implemented by the processing circuit 146, or the functions of these parts may be collectively implemented by the processing circuit 146.

In the case where the processing circuit is a CPU, the functions of the image processing part 142 and the visual inspection part 143 are realized by software, firmware, or a combination thereof. The software or the firmware is written as a program and stored in a memory 149. The processing circuit realizes the functions of these parts by reading and executing the programs recorded in the memory 149. It can be said that these programs serve to make a computer execute a procedure or a method of the image processing part 142 and the visual inspection part 143. Here, the memory 149 corresponds to, for example, a volatile or non-volatile semiconductor memory, such as an RAM, an ROM, or a flash memory, or a magnetic disc, a flexible disc, an optical disc, or a DVD.

Figure 6:
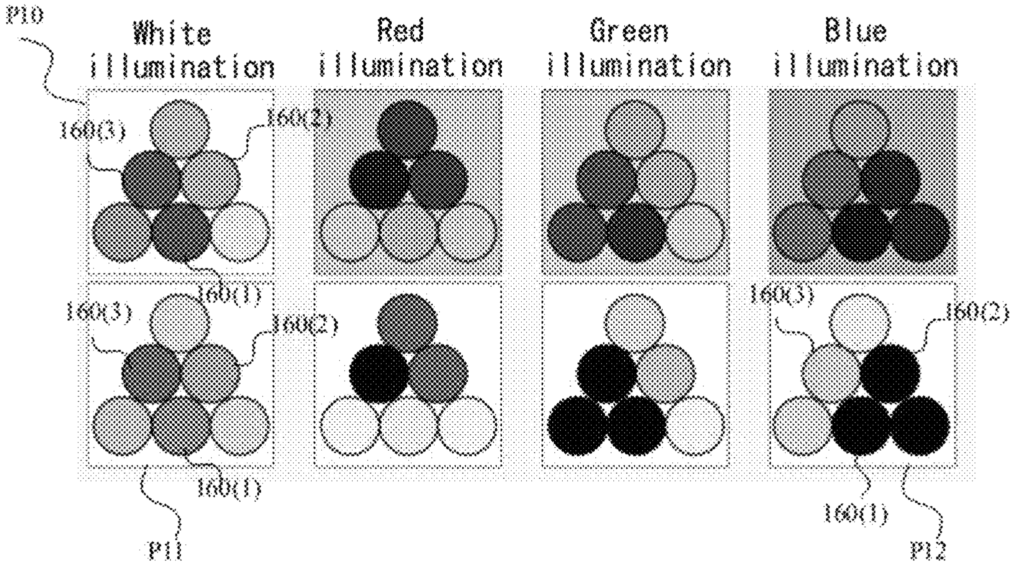
FIG. 6 is a view illustrating a first role of the filters according to the first embodiment of this disclosure.

FIG. 6 is a view illustrating a first role of the filters according to the first embodiment of this disclosure. A schematic view showing the relationship between the contrast of an image taken by a camera and the color of illumination is provided by Non-Patent Literature 1 (Handbook of OPTEX FA Co., Ltd.). In FIG. 6, the figures in the upper tier show images obtained by a color camera. The figures in the lower tier show images obtained by a monochromatic camera.

First, an image obtained by the color camera under white illumination (panel P10 in FIG. 6) allows differences among colors to be recognized as by visual observation. For example, each of a red area 160 (1), a green area 160 (2), and a blue area 160 (3) can be recognized.

On the other hand, in an image obtained by the monochromatic camera under white illumination (panel P11), the differences among the color areas 160 are represented by white-black contrast. Thus, in a visual inspection step of semiconductor manufacturing, when an image is obtained using a monochromatic camera or also when an image is obtained using a color camera, the image is often turned into a white-black image by image processing for a visual quality inspection. In this case, an image with low white-black contrast makes it difficult to detect defects through binarization processing.

This problem can be dealt with through appropriate selection of the illumination color. For example, in an image obtained by the monochromatic camera under blue illumination (panel P12), the difference between the red area 160 (1) and the blue area 160 (3) is more strongly represented than under white illumination (panel P11).

Also in the semiconductor inspection apparatus 100, the wavelength of the light source 102 can be changed using a filter 125 of an appropriate color so as to obtain a clearer contrast image by the camera 111. As a result, the accuracy of detecting defects in a visual inspection step can be increased.

Figure 7:
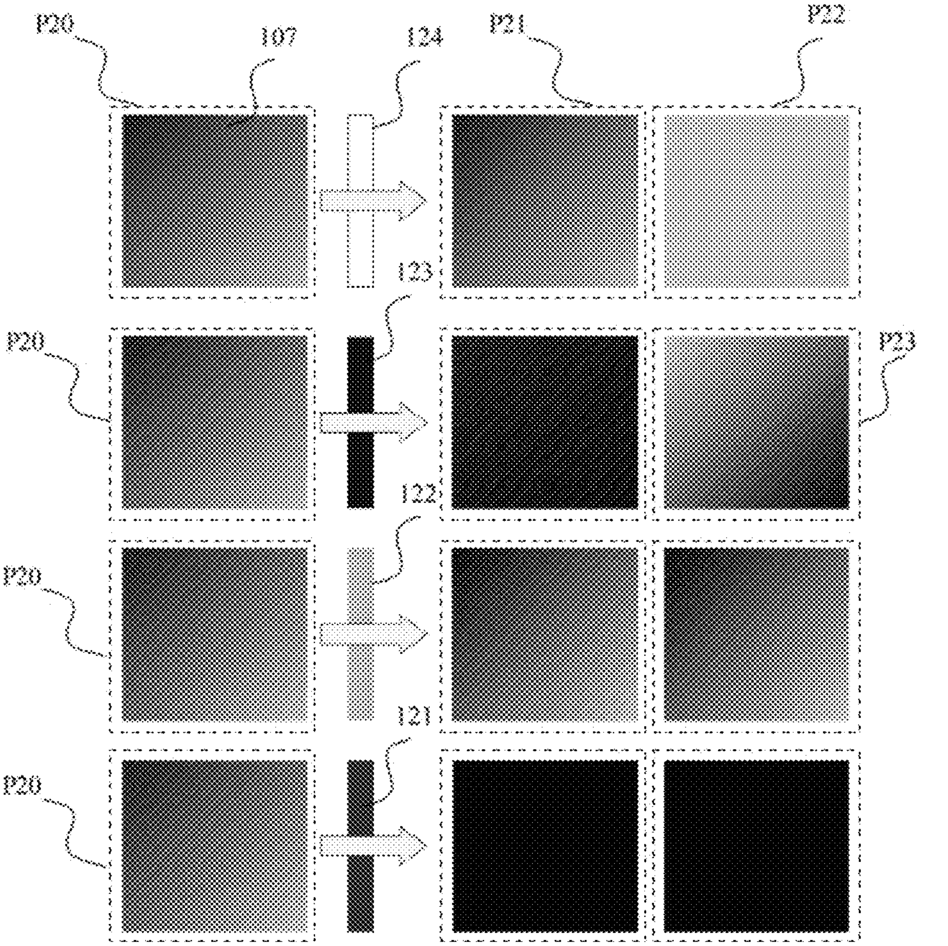
FIG. 7 is a view illustrating a second role of the filters according to the first embodiment of this disclosure.

FIG. 7 is a view illustrating a second role of the filters according to the first embodiment of this disclosure. First, it is assumed that there is, under visual observation, a color gradation due to unevenness in film thickness in the surface of the inspection target 107 (panel P20). Here, it is assumed that blue increases toward the left upper end of the inspection target 107 and green increases toward the right lower end thereof. An image taken of this inspection target 107 by the color camera under illumination having been transmitted through the colorless filter 124 is the same as the image under visual observation (panel P20).

On the other hand, even under the same white illumination, an image taken by the monochromatic camera (panel P22) is an image having uniform brightness without contrast within the plane of the inspection target 107. This is because, based on the principle described with FIG. 6, the green area 160 (2) and the blue area 160 (3) have no great contrast difference under white illumination (panel P11 in FIG. 6). This effect is advantageous in a visual inspection step of semiconductor manufacturing in terms of preventing occurrence of luminance shading due to unevenness in film thickness and making a flat part and other parts of the surface easily distinguishable through binarization processing. Thus, even when the inspection target 107 is uneven in film thickness, an image having uniform brightness within the plane can be obtained by obtaining a monochromatic image using white illumination.

On the other hand, an image taken of the same inspection target 107 as in panel P20 by the monochromatic camera under blue illumination having been transmitted through the blue filter 123 (panel P23) has a stronger gradation than under white illumination (panel P22). This is because, as described with FIG. 6, the green area 160 (2) and the blue area 160 (3) have a great contrast difference under blue illumination (panel P12 in FIG. 6). In a visual inspection step, this effect works disadvantageously for binarization processing, as it causes luminance shading due to unevenness in film thickness and thereby creates a difference in contrast also in a flat surface.

As has been described above, the wavelength of the light source 102 can be changed using an appropriate filter 125 so as to prevent occurrence of luminance shading due to unevenness in film thickness in the camera 111 and obtain an image having uniform brightness. As a result, the accuracy of detecting defects in the semiconductor inspection apparatus 100 can be improved.

As has been described above using FIG. 1 to FIG. 7, the semiconductor inspection apparatus 100 in this embodiment performs a visual inspection by switching between the coaxial vertical illumination system 112 and the ring illumination system 115. In the coaxial vertical illumination system 112, the wavelength is selected by the bandpass filter base 120. In addition, in the ring illumination system 115, the wavelength is selected so as to obtain desired reflection characteristics relative to a material composing an object being inspected. Thus, by using the two types of illumination systems and appropriately selecting the wavelength of each illumination system, an image can be obtained that allows a flat part and an irregular part, different materials, etc. of the inspection target 107 to be distinguished from each other with high contrast. In this way, the semiconductor inspection apparatus 100 can detect defects and exclude visually defective products in a visual inspection step even when the inspection target has surface irregularities.

The semiconductor inspection apparatus 100 described in this embodiment exhibits particularly significant advantages in a visual inspection of, as the inspection target 107, a semiconductor module on a surface of which a plurality of semiconductor devices electrically connected to one another by a wire is mounted. For example, this semiconductor inspection apparatus 100 is suitable when the inspection target is a chip constituting a flat surface and a wire constituting an irregularity in a power semiconductor module used for power control, and defects such as flaws formed in the chip and the wire, contaminants, wire-bonding shape abnormality, and wire-loop shape abnormality.

By using the two types of illumination systems included in the semiconductor inspection apparatus 100 of this disclosure and appropriately selecting the wavelength of each illumination system, the advantage of obtaining not only an image of an edge part of a lead frame in a power semiconductor module can be achieved. For example, the advantage of being able to obtain a clear image of an edge of a semiconductor chip mounted on the lead frame can be achieved. Further, an image of a defective edge of a few-micrometer order formed on the chip or an image of a wire edge can be obtained.

Modified Examples: in the example of FIG. 1, using a halogen lamp as the light source 102 has been described. However, the light source 102 may instead be a white LED. When a white LED is used, high-luminance light can be emitted, so that a higher-contrast image can be obtained in the coaxial vertical illumination system 112. In addition, as an LED has higher on-off responsiveness than a halogen lamp, the time to wait for switching with the ring illumination system 115 can be reduced and the inspection takt time can be thereby shortened.

The semiconductor devices included in the semiconductor module to be inspected by the semiconductor inspection apparatus 100 in this embodiment are not limited to those formed by silicon, but may instead be those formed by a wide bandgap semiconductor having a greater bandgap than silicon. Examples of wide bandgap semiconductors include silicon carbide, gallium nitride-based materials, and diamond. Having high voltage resistance and allowable current density, a semiconductor device formed by such a wide bandgap semiconductor can be reduced in size. By using this small-sized semiconductor device, the semiconductor module incorporating this semiconductor device can also be reduced in size and increased in degree of integration. Moreover, since the semiconductor device has high heat resistance, a heat radiation fan of a heatsink can be reduced in size and a water-cooling part can be changed into an air-cooling part, which allows a further reduction in size of the semiconductor module. In addition, since the semiconductor device has low power loss and high efficiency, the efficiency of the semiconductor module can be increased. While it is desirable that all the semiconductor devices be formed by a wide bandgap semiconductor, the advantages described in this embodiment can be achieved also when only one of them is formed by a wide bandgap semiconductor. The same applies to all the following embodiments.

In this embodiment, the case has been described in which the casing in which the light source 102 and the bandpass filter base 120 are arranged is the cylindrical first cylinder 101, and the casing in which the ring light 130 is arranged is the cylindrical second cylinder 105. However, the shapes of these casings need not be limited to cylindrical shapes, and can be suitably designed according to the use conditions of the semiconductor inspection apparatus 100. The same applies to all the following embodiments.

Further, the semiconductor inspection apparatus 100 in this embodiment is not limited to the example of FIG. 1, and various changes can be made in an implementation stage within the scope of the gist of the embodiment. For example, the semiconductor inspection apparatus 100 may include a plurality of optical devices, such as lenses, that performs adjustment of an optical axis and focal adjustment. The same applies to the following embodiments.

Second Embodiment

Figure 8:
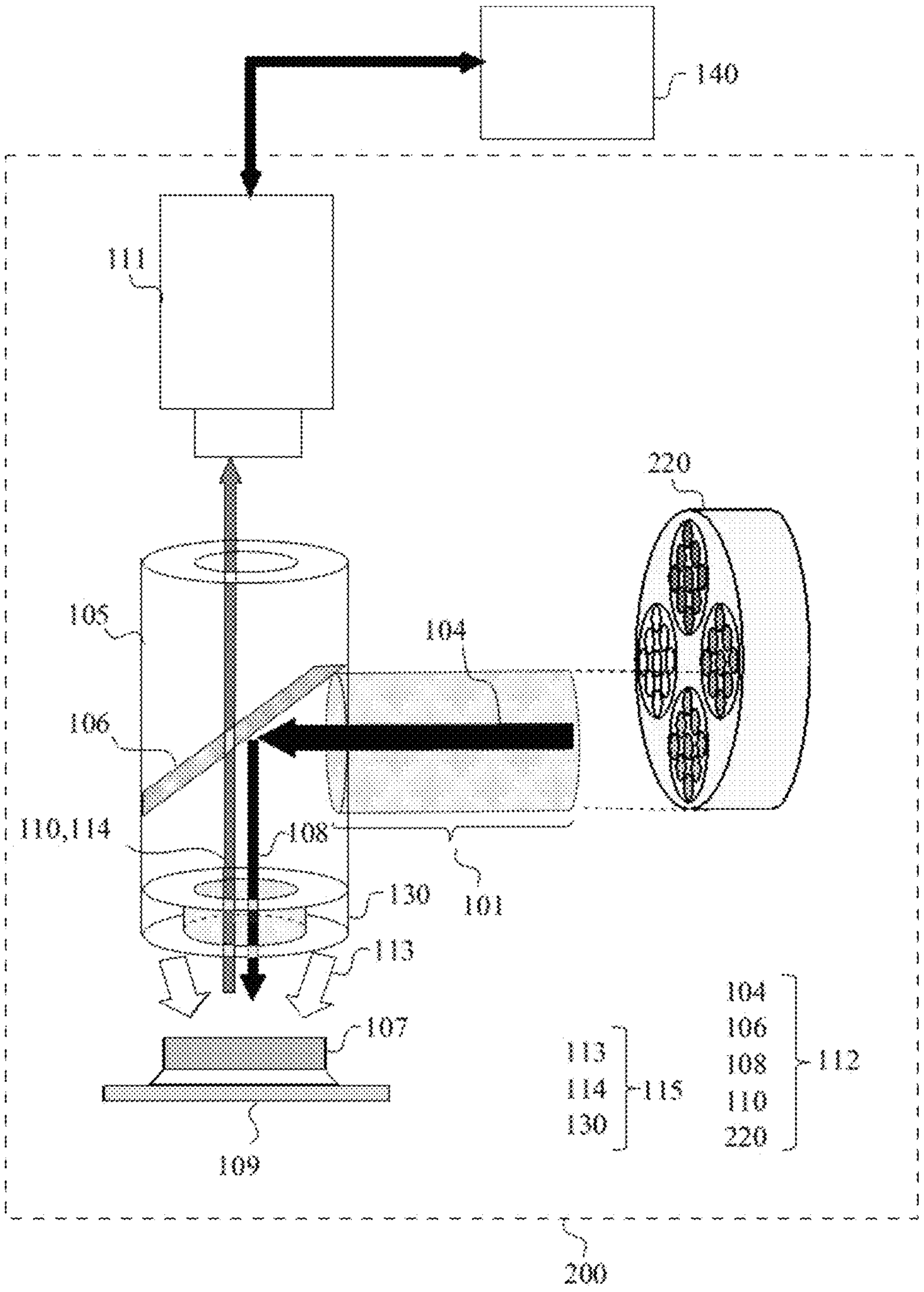
FIG. 8 is a view showing an example of the configuration of a semiconductor inspection apparatus in a second embodiment of this disclosure.

FIG. 8 is a view showing an example of the configuration of a semiconductor inspection apparatus in a second embodiment of this disclosure. A semiconductor inspection apparatus 200 has the same structure as the semiconductor inspection apparatus 100 of the first embodiment except that the light source 102 and the bandpass filter base 120 of the coaxial vertical illumination system 112 have been replaced with an optical base 220.

The optical base 220 is included in the first cylinder 101 and functions as a light source of the coaxial vertical illumination system 112. The optical base 220 includes a plurality of light sources each having a different wavelength in the visible light range, and can generate monochrome light 104 of the coaxial vertical illumination system 112 by selecting one of these light sources. Unlike the selection of a wavelength using the filters 125 that has been described in the first embodiment, attenuation of the amount of light does not occur, so that the inspection target 107 can be irradiated with high-luminance light and a higher-contrast image than in the first embodiment can be obtained.

Figure 9:
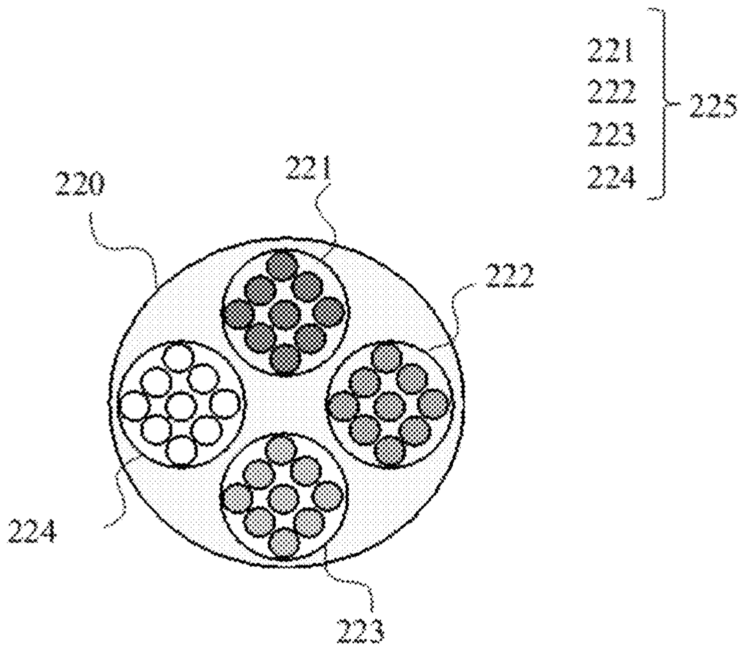
FIG. 9 is a view showing an example of the configuration of the optical base according to the second embodiment of this disclosure.

FIG. 9 is a view showing an example of the configuration of the optical base according to the second embodiment of this disclosure. The optical base 220 includes LED lights of a plurality of colors each composed of a plurality of LED light sources of the same color. For example, in the example of FIG. 9, the optical base 220 includes a red LED light 221 composed of a plurality of red LED light sources. Similarly, the optical base 220 includes a green LED light 222, a blue LED light 223, and a white LED light 224. Hereinafter, when it is not necessary to specify an LED light of a specific color and the description applies to the LED lights of all the colors, these LED lights will be denoted by a new reference sign and written as LED lights 225.

In the optical base 220, the LED lights 225 of the respective colors are annularly arranged. Further, as with the bandpass filter base 120 of the first embodiment, the optical base 220 has a rotating shaft axis is parallel to the central axis of the first cylinder 101. As in the first embodiment, as the optical base 220 rotates, each of the LED lights 225 sequentially faces the reflective surface of the half mirror.

Thus, by using the LED lights 225 each composed of a plurality of LEDs of the same color, the monochromatic light 104 having a sufficient amount of light and an irradiation region can be generated in the coaxial vertical illumination system 112. As a result, a high-contrast image can be obtained while a sufficient visual field for observation is secured.

As has been described above, in the semiconductor inspection apparatus 200 of this embodiment, the optical base 220 including the plurality of LED lights 225 each composed of a plurality of LED light sources of the same color is used as the light source in the coaxial vertical illumination system 112. This makes it possible to obtain a higher-contrast image by avoiding attenuation of light during selection of a wavelength.

It should be noted that the coaxial vertical illumination system 112 in this embodiment is an optical system including the monochromatic light 104, the half mirror 106, the normal incident light 108, the returning light 110, and the optical base 220.

Third Embodiment

Figure 10:
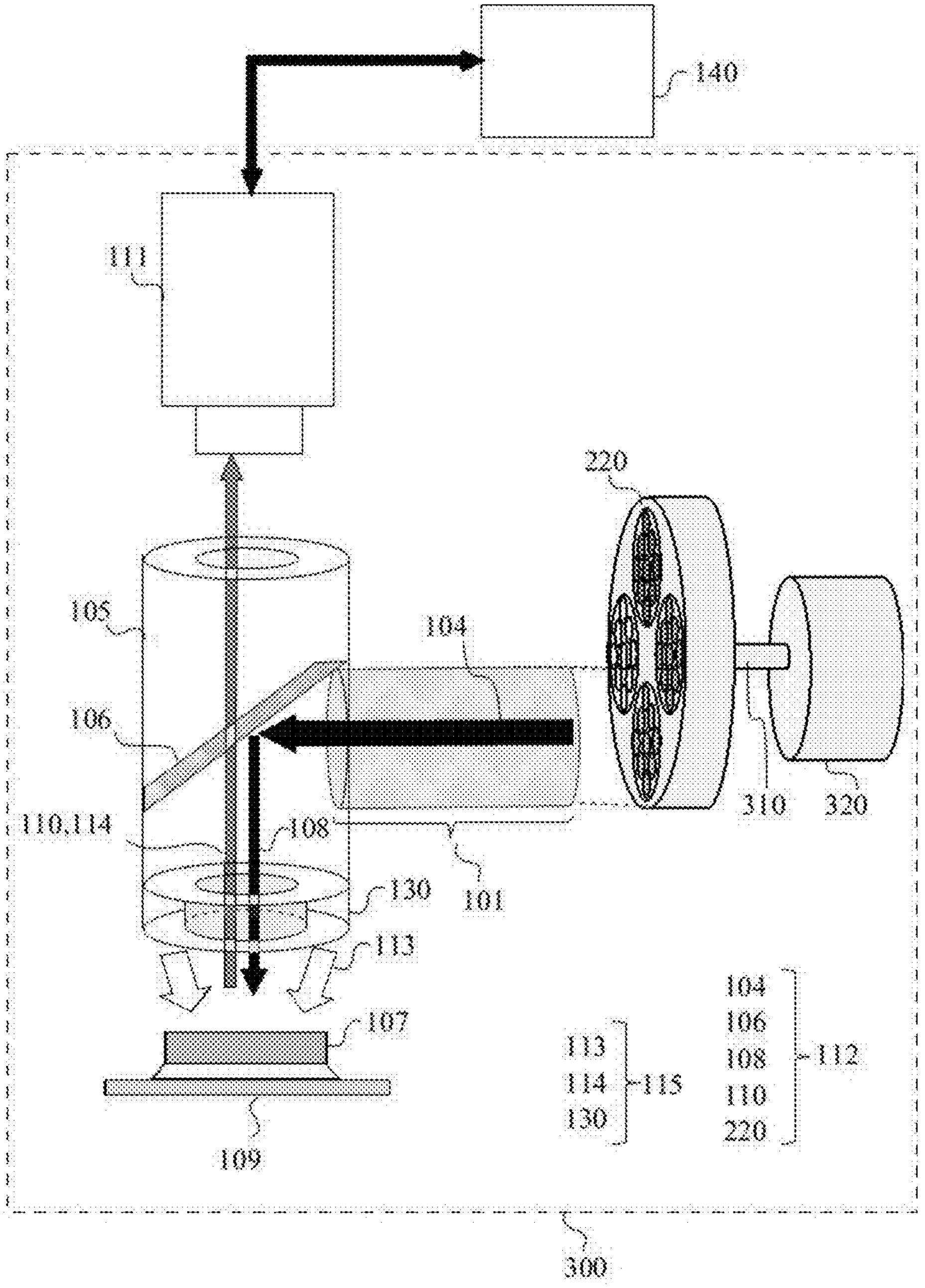
FIG. 10 is a view showing an example of the configuration of a semiconductor inspection apparatus in a third embodiment of this disclosure.

FIG. 10 is a view showing an example of the configuration of a semiconductor inspection apparatus in a third embodiment of this disclosure. A semiconductor inspection apparatus 300 has the same structure as the semiconductor inspection apparatus 200 of the second embodiment except that a stepping motor 320 is connected to the optical base 220 through a shaft 310. The shaft 310 of the stepping motor 320 is fixed at the center of rotation of the optical base 220, and the optical base 220 can rotate automatically under motor control.

In the semiconductor inspection apparatus 300, the timing of the camera 111 imaging the inspection target 107 and the timing of the stepping motor 320 rotating the optical base 220 can be synchronized with each other such that the inspection target 107 is imaged while being sequentially and automatically irradiated by the LED lights 225 of the respective colors. Thus, the need to manually switch the LED lights 225 for inspection targets 107 varying in structure and color can be eliminated, and the inspection step can be automated.

Fourth Embodiment

Figure 11:
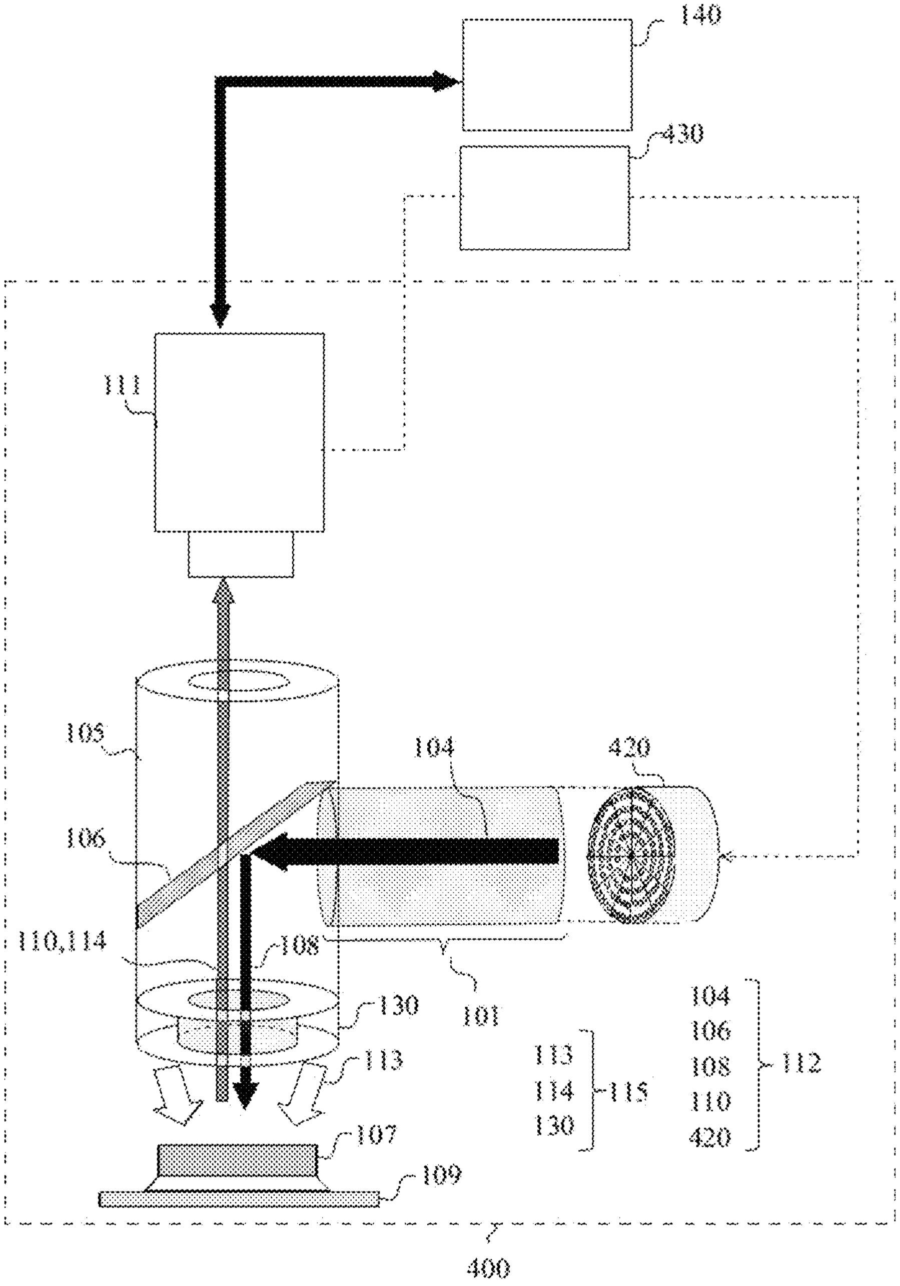
FIG. 11 is a view showing an example of the configuration of a semiconductor inspection apparatus in a fourth embodiment of this disclosure.

FIG. 11 is a view showing an example of the configuration of a semiconductor inspection apparatus in a fourth embodiment of this disclosure. A semiconductor inspection apparatus 400 has a second optical base 420 that is different from the optical base 220 of the semiconductor inspection apparatus 200 of the second embodiment in the size and in the arrangement of the LED lights 225.

The second optical base 420 is included in the first cylinder 101, but unlike the above-described optical base

220, it does not rotate. The size of the second optical base 420 is equivalent to the size of a cross-section of the first cylinder 101. In the second optical base 420, the LED lights 225 of the respective colors are arranged such that light emitted from each LED light 225 passes through the inside of the first cylinder.

The semiconductor inspection apparatus 400 further includes an LED control unit 430 that is connected to the camera 111 and the second optical base 420. The LED control unit 430 selects and turns on one of the LED lights 225 in synchronization with the imaging timing of the camera 111. Thus, not only can the monochromatic light 104 of a selected wavelength be emitted at the imaging timing of the camera 111 as in the third embodiment, but also the need for the large-sized optical base 220 including a rotating axis and for the stepping motor 320 can be eliminated. As a result, the unit of the coaxial vertical illumination system 112 and the ring illumination system 115 that is mounted on a head part of the camera 111 can be reduced in size.

It is not essential for the semiconductor inspection apparatus 400 to include the LED control unit 430 among its constituent elements.

It should be noted that the coaxial vertical illumination system 112 in this embodiment is an optical system including the monochromatic light 104, the half mirror 106, the normal incident light 108, the returning light 110, and the second optical base 420.

Figure 12:
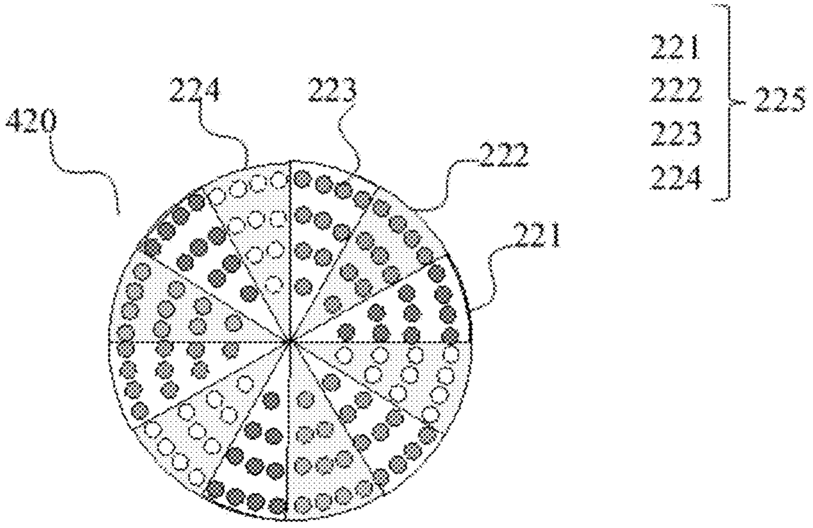
FIG. 12 is a view showing an example of the configuration of the second optical base according to the fourth embodiment of this disclosure.

FIG. 12 is a view showing an example of the configuration of the second optical base according to the fourth embodiment of this disclosure. The second optical base 420 has a structure in which the LED lights 225 each composed of a plurality of LEDs of the same color are each radially arranged. For example, in the example of FIG. 12, the second optical base 420 includes the red LED light 221 composed of a plurality of red LEDs. In this structure, the green LED light 222, the blue LED light 223, and the white LED light 224 are provided in this order next to the red LED light 221, and this pattern is repeated.

Thus arranging the LED lights 225 having the respective colors radially and repeatedly can equalize the intensity of the monochromatic light 104 of each color emitted from the second optical base 420. Further, normal incident light 108 having a uniform in-plane distribution of intensity can be generated in the coaxial vertical illumination system 112.

As has been described above using FIG. 11 and FIG. 12, in the semiconductor inspection apparatus 400 of this embodiment, the second optical base 420 in which the LED lights 225 of the respective colors are radially and repeatedly arranged is used. Further, the selection of an illumination color in the coaxial vertical illumination system 112 and the imaging timing of the camera 111 are controlled by the LED control unit 430. Thus, both a reduction in size of the apparatus and automation thereof can be realized at the same time.

In this embodiment, the case where the LED lights 225 of the respective colors are radially and repeatedly arranged in the second optical base 420 has been described. However, the form of arrangement of the LED lights 225 need not be this one, and they can be suitably arranged according to the use conditions of the semiconductor inspection apparatus 400.

The functions fulfilled by the LED control unit 430 in this embodiment may be realized by software using a computer that includes a CPU and a memory and has programs stored in the memory. Alternatively, these functions may be realized by hardware using a dedicated circuit, such as an FPGA or an ASIC.

Fifth Embodiment

Figure 13:
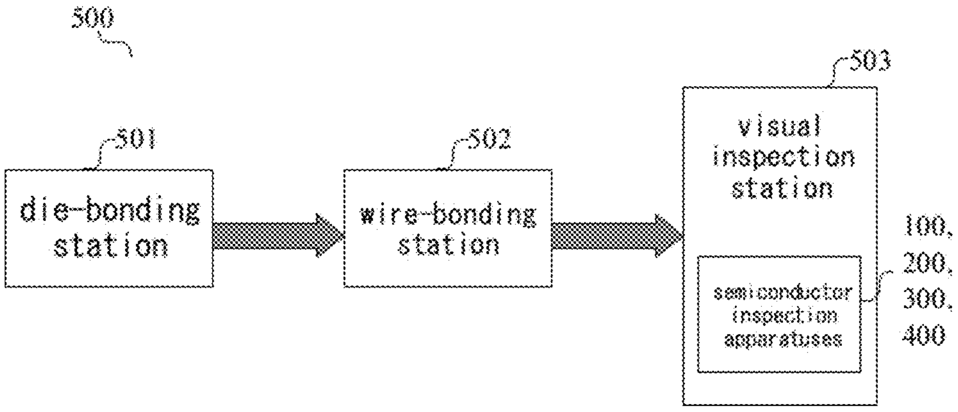
FIG. 13 is a view showing an example of the configuration of a semiconductor manufacturing apparatus in a fifth embodiment of this disclosure.

FIG. 13 is a view showing an example of the configuration of a semiconductor manufacturing apparatus in a fifth embodiment of this disclosure. A semiconductor manufacturing apparatus 500 includes a die-bonding station 501, a wire-bonding station 502, and a visual inspection station 503. The die-bonding station 501 is a part inside the semiconductor manufacturing apparatus 500 that performs a manufacturing step of joining a back surface of a semiconductor device to a matrix of a power semiconductor module. Similarly, the wire-bonding station 502 is a part that performs a manufacturing step of electrically connecting an electrode exposed from an external device and a surface of the semiconductor device mounted on the power semiconductor module to each other. Further, the visual inspection station 503 is a part that includes one of the semiconductor inspection apparatuses having been described in the first to fourth embodiments and performs a visual inspection.

Thus, it is possible to reduce the installation area and achieve a reduction in size of the footprint by producing the semiconductor manufacturing apparatus 500 that collectively performs the manufacturing steps and the inspection step.

Description of Terms Used in Claims

The constituent element described in the first to fourth embodiments that generates the monochromatic light 104 of the coaxial vertical illumination system 112 is called a first light source. For example, in the first embodiment, the first light source refers to the light source 102 and the bandpass filter base 120. Similarly, in the second embodiment, the first light source refers to the optical base 220. In the third embodiment, the first light source refers to the optical base 220, the shaft 310, and the stepping motor 320. In the fourth embodiment, the first light source refers to the second optical base 420.

Similarly, the light source of the ring illumination system 115 described in the first to fourth embodiments is called a second light source. The second light source is the ring light 130.

The first cylinder 101 and the second cylinder 105 described in the first to fourth embodiments are called a first casing and a second casing, respectively.

The die-bonding station 501 described in the fifth embodiment is called a first unit. Similarly, the wire-bonding station 502 is called a second unit, and the visual inspection station 503 is called a third unit.

Obviously many modifications and variations of the present disclosure are possible in the light of the above teachings. It is therefore to be understood that within the scope of the appended claims the invention may be practiced otherwise than as specifically described.

Description of terms used in claims: the constituent element described in the first to fourth embodiments that generates the monochromatic light 104 of the coaxial vertical illumination system 112 is called a first light source. For example, in the first embodiment, the first light source refers to the light source 102 and the bandpass filter base 120. Similarly, in the second embodiment, the first light source refers to the optical base 220. In the third embodiment, the first light source refers to the optical base 220, the shaft 310, and the stepping motor 320. In the fourth embodiment, the first light source refers to the second optical base 420.

Similarly, the light source of the ring illumination system 115 described in the first to fourth embodiments is called a second light source. The second light source is the ring light 130.

The first cylinder 101 and the second cylinder 105 described in the first to fourth embodiments are called a first casing and a second casing, respectively.

The die-bonding station 501 described in the fifth embodiment is called a first unit. Similarly, the wire-bonding station 502 is called a second unit, and the visual inspection station 503 is called a third unit.

The entire disclosure of a Japanese Patent Application No. 2022-138639, filed on Aug. 31, 2022 including specification, claims, drawings and summary, on which the Convention priority of the present application is based, are incorporated herein by reference in its entirety.

The invention claimed is:

1. A semiconductor inspection apparatus that performs a visual inspection of, as an inspection target, a semiconductor module on a surface of which a plurality of semiconductor devices connected to one another by a wire is mounted, the semiconductor inspection apparatus comprising:
- a first light source that is arranged in a first casing and emits light in a specific wavelength band or white light;
- a half mirror that is arranged inside a second casing joined to the first casing, and that reflects part of light having been emitted from the first light source and having passed through the first casing to generate incident light that normally enters the inspection target;
- a camera that is arranged on a same axis as an optical axis of the incident light and an optical axis of reflected light resulting from the incident light being reflected by the inspection target, and that images transmitted light having been transmitted through the half mirror; and
- a second light source that obliquely irradiates the inspection target with light in at least one wavelength range among a red band, a blue band, and an infrared range, the second light source being arranged in a ring shape around the optical axis of the incident light, wherein the first light source is an optical base including:
- a red light emitting diode (LED) light including a plurality of red LED light sources that are annularly arranged;
- a green LED light including a plurality of green LED light sources that are annularly arranged;
- a blue LED light including a plurality of blue LED light sources that are annularly arranged; and
- a white LED light including a plurality of white LED light sources that are annularly arranged, a rotating shaft axis of the optical base is parallel to a central axis of the first casing;

the red LED light, the green LED light, the blue LED light, and the white LED light are annularly arranged around the rotating shaft axis, wherein the optical base is configured to rotate around the rotating shaft axis such that the red LED light, the green LED light, the blue LED light, and the white LED light selectively face a reflective surface of the half mirror.

2. The semiconductor inspection apparatus according to claim 1, wherein the wire that connects the semiconductor devices to one another is mainly made of at least one of gold, silver, and copper.

3. The semiconductor inspection apparatus according to claim 1, further comprising a stepping motor, and wherein the stepping motor rotates the optical base in synchronization with an imaging timing of the camera.

4. The semiconductor inspection apparatus according to claim 1, further comprising an image processing unit, wherein the image processing unit is configured to execute:
- a process in which an image signal is input;
- image processing of editing an image in response to the image signal;
- a process of performing a visual inspection of the inspection target based on data resulting from the image processing; and
- a process of outputting a determination result of the visual inspection.

5. The semiconductor inspection apparatus according to claim 1, wherein the semiconductor devices are formed by wide bandgap semiconductors.

6. A semiconductor manufacturing apparatus comprising:
- a first unit that performs a manufacturing step of joining a back surface of a semiconductor device to a matrix of a power semiconductor module;
- a second unit that performs a manufacturing step of electrically connecting an electrode exposed from another device and a surface of the semiconductor device to each other; and
- a third unit that includes the semiconductor inspection apparatus according to claim 1 and performs a visual inspection of a power semiconductor module manufactured in the first unit and the second unit.

* * * * *